United States Patent [19]

Tompkins et al.

[11] Patent Number: 5,611,883

[45] Date of Patent: Mar. 18, 1997

[54] JOINING CERAMICS AND ATTACHING FASTENERS TO CERAMICS BY GAS PHASE SELECTIVE BEAM DEPOSITION

[75] Inventors: James V. Tompkins; Britton R. Birmingham; Kevin J. Jakubenas; Harris L. Marcus, all of Austin, Tex.

[73] Assignee: Board Of Regents, The University of Texas System, Austin, Tex.

[21] Appl. No.: 369,820

[22] Filed: Jan. 9, 1995

[51] Int. Cl.$^6$ .................................................... B32B 31/00
[52] U.S. Cl. .................................. 156/272.8; 156/379.6; 264/81; 425/174; 427/255.1; 427/561; 427/596; 219/121.12; 219/121.36; 219/121.6; 118/50.1; 118/620; 118/715
[58] Field of Search ............................... 156/242, 272.2, 156/272.8, 285, 379.6, 382; 264/401, 81, 85; 425/174; 427/255.1, 561, 596, 562, 566; 219/121.12, 121.36, 121.6, 121.8; 118/715, 50.1, 620, 728

[56] References Cited

U.S. PATENT DOCUMENTS

| | | | |
|---|---|---|---|
| 2,599,947 | 6/1952 | Sherman et al. | 118/104 |
| 2,918,896 | 12/1959 | Uhleen | 118/118 |
| 2,961,336 | 11/1960 | Uhleen | 427/318 |
| 3,063,407 | 11/1962 | Bergstein | 118/104 |
| 3,243,317 | 3/1966 | Baker | 134/15 |

(List continued on next page.)

FOREIGN PATENT DOCUMENTS

| | | |
|---|---|---|
| 130398 | 1/1985 | European Pat. Off. . |
| 199585 | 10/1986 | European Pat. Off. . |
| 336672 | 10/1989 | European Pat. Off. . |
| 2263277 | of 1991 | Germany . |
| WO88/02677 | 4/1988 | WIPO . |

OTHER PUBLICATIONS

Massey, A. G., et al., "The Direct Synthesis of Non–Transition–Metal Organo Derivatives", *Aldrichimica Acta*, vol. 22, No. 2 (1989).

Fudim, E. V., "Sculpting Parts with Light", *Machine Design* (Mar. 6, 1986), pp. 102–106.

"Laser–Cut Laminations Form Complex Parts", *Machine and Tool Bluebook*, (Apr., 1987), p. 36.

Hydronetics, Inc. product literature, "Immediate Production of 3–D Objects," Hydronetics, Inc., 2201 W. Campbell Park Drive, Chicago, IL 60612.

(List continued on next page.)

*Primary Examiner*—James Sells
*Attorney, Agent, or Firm*—Arnold, White & Durkee

[57] ABSTRACT

A process for joining solid compositions, comprising placing a first solid composition having a first joining zone and a second solid composition having a second joining zone in a chamber; positioning a first gas phase, which comprises a substance that decomposes to a material that adheres to the first and second solid compositions during the process, proximate the target area; directing an energy beam to the first and second joining zones to selectively deposit material from the first gas phase on the first joining zone and the second joining zone until a joint is formed between the first and second solid compositions wherein the joint adheres to the first and second compositions at the first and second joining zones. A process useful for attaching a solid fastener to a solid composition, comprising: placing the solid composition in a chamber; positioning a first gas phase, which comprises a substance that decomposes to a material that adheres to the solid composition during the process, proximate the solid composition; directing at least one energy beam to the solid composition to selectively deposit material from the first gas phase on the solid composition to form the solid fastener attached to the solid composition. The invention can also be used to repair solid compositions which contain defects such as chips or cracks or to modify the preexisting shape by localized addition of material from the gas phase.

14 Claims, 2 Drawing Sheets

U.S. PATENT DOCUMENTS

| | | | |
|---|---|---|---|
| 3,279,424 | 10/1966 | Brown et al. | 118/119 |
| 3,280,230 | 10/1966 | Bradshaw | 264/448 |
| 3,301,725 | 1/1967 | Frontera | 156/59 |
| 3,312,191 | 4/1967 | Lowe | 118/104 |
| 3,539,410 | 11/1970 | Meyer | 156/58 |
| 3,848,104 | 11/1974 | Locke | 219/121.65 |
| 3,911,174 | 10/1975 | Rose | 427/211 |
| 3,932,923 | 1/1976 | DiMatteo | 29/407 |
| 3,985,995 | 10/1976 | Brandi | 219/76.12 |
| 4,117,302 | 9/1978 | Earle | 219/121.64 |
| 4,135,902 | 1/1979 | Oehrle | 65/392 |
| 4,270,675 | 6/1981 | Wicks et al. | 222/196 |
| 4,292,342 | 9/1981 | Sarma et al. | 264/81 |
| 4,300,474 | 11/1981 | Livsey | 118/641 |
| 4,323,756 | 4/1982 | Brown | 219/121.66 |
| 4,474,861 | 10/1984 | Ecer | 428/614 |
| 4,503,096 | 3/1985 | Specht | 427/359 |
| 4,540,867 | 9/1985 | Ackerman | 219/121.8 |
| 4,575,330 | 3/1986 | Hull | 425/174.4 |
| 4,752,352 | 6/1988 | Feygin | 216/33 |
| 4,758,388 | 7/1988 | Hamada et al. | 264/400 |
| 4,818,562 | 4/1989 | Arcella et al. | 427/597 |
| 4,863,538 | 9/1989 | Deckard | 264/497 |
| 4,888,490 | 12/1989 | Bass et al. | 250/559.16 |
| 4,944,817 | 7/1990 | Bourell et al. | 264/497 |
| 5,017,317 | 5/1991 | Marcus | 264/81 |
| 5,135,695 | 8/1992 | Marcus | 264/141 |
| 5,169,579 | 12/1992 | Marcus et al. | 264/81 |
| 5,173,220 | 12/1992 | Reiff et al. | 264/401 |
| 5,306,447 | 4/1994 | Marcus et al. | 264/497 |

OTHER PUBLICATIONS

"Lasers Carve Complex 3–D Parts", (pp. 1–11), Hydronetics, Inc., 2201 W. Campbell Park Drive, Chicago, IL 60612.

Sample Cover Letter from Hydronetics, Inc.

*Chicago Enterprise,* vol. I, No. II (May 1987).

*Crain's Chicago Business* (1987).

"Laser Machining: Laser Process Makes Complex 3–D Parts." *Laser Focus/Electro-Optics* magazine, p. 41 (Jun. 1987).

"Build 3D Parts from Drawings in Minutes," *Inside R&D,* vol. 16, No. 19 (May 13, 1987).

"3–D Physical Modeling Systems Bloom," *Electronic Engineering Times,* No. 430, p. 41 (Apr. 20, 1987).

Takei, et al., "Rhenium Film Preparation by Laser Melting", *Journal of Applied Physics,* pp. 2903–2908 (May, 1980).

Deckard, et al., "Solid FreeForm Fabrication and Selected Powder Sintering", Proceedings, 15th Conference on Production Research and Technology, University of California, Berkley (1989) pp. 623–628.

International Search Report dated Dec. 4, 1990, PCT Application No. US90/07084.

International Search Report Dated Jun. 23, 1992, PCT Application No. US92/02008.

International Search Report dated Dec. 15, 1992, PCT Application No. US92/06588.

JOINING CERAMICS AND ATTACHING FASTENERS TO CERAMICS BY GAS PHASE SELECTIVE BEAM DEPOSITION

The united State Government has rights in the present invention pursuant to the terms of Contract No. N00014-92-J-1514 awarded by the Office of Naval Research.

BACKGROUND OF THE INVENTION

This invention relates to a method utilizing a directed energy beam to selectively deposit material from a gas phase to either join two or more distinct ceramic, metal or composite bodies, to attach a fastener to such a body or to repair such a body.

Previously, solid compositions have been joined together by a wide variety of techniques depending on materials to be joined. For instance, metal pieces can be joined together by several welding techniques. There are many methods of joining ceramics, metals, and composites presently in use. Examples of the techniques presently used include use of low melting temperature glasses as a binder, sometimes coupled through an electric field; liquid phase joining with low temperature brazes; and solid state bonding by either direct application of pressure and temperature to the parts to be joined or through a lower melting temperature material at the joining interface, sometimes resulting in chemical modification at the interface. In many of these approaches the lower melting temperature binding material limits the operating temperature of the bonded part. In addition, the chemical stability at high temperature can be compromised. The approaches which use pressure require fixturing, and are not readily applicable in many complex geometries. In none of these approaches does the bonding material originate as a gas precursor.

Similarly, methods of attaching fasteners to ceramic pieces are also limited. Typically, fasteners are attached by use of various organic-based glues or by bolting the fastener to the piece. Glues, however, may weaken over time, and bolts usually require drilling holes in the ceramic piece which may weaken the piece or require setting of the bolt in the piece while the ceramic piece is cast.

Techniques for joining ceramics have a wide range of difficulties. Examples of these difficulties are: use of dissimilar fastening material can have problems with mismatch in coefficient of thermal expansion inducing stresses; use of lower melting temperature materials as fasteners limits applicability of the total system at higher temperatures; and introduction of stress risers in the ceramic to accommodate fasteners can lead to fracture of the ceramics. The materials used to make the fastener can add a chemical incompatibility.

SUMMARY OF THE INVENTION

In one respect, this invention is a process for joining solid compositions, comprising placing a first solid composition having a first joining zone and a second solid composition having a second joining zone in a chamber, positioning a first gas phase, which comprises a substance that decomposes to a material that adheres to the first and second solid compositions during the process, proximate the first and second joining zones, directing an energy beam to the first and second joining zones to selectively deposit material from the first gas phase on the first joining zone and the second joining zone until a joint is formed between the first and second solid compositions wherein the joint adheres to the first and second compositions at the first and second joining zones.

In this first aspect of the invention, it should be appreciated the first and second solid compositions become by practice of this invention joined together. The joint can also be made to a porous surface region in the solid composition where the gas phase will decompose into the surface porous region to create a strong combined mechanical and chemical bond to the solid where the joint is located. It should also be appreciated the first and second compositions may be the same composition such as when, for example, a circular object is to be connected at one point, or when a gap between pieces of a single fixture are meant to be connected. Further, more than two solid compositions can be joined by practice of this invention so long as the additional solid compositions are placed in the chamber. Moreover, solid compositions can be sequentially joined together by the practice of this aspect of the invention such that a first and second solid composition are joined together followed by joining of a third solid composition to the previously joined composition resulting from the first and second solid compositions. In the practice of this invention, it is also contemplated that the joining process will also serve as a method to repair a solid body which has a chip, crack or similar defect.

In a second respect, this invention is a process useful for attaching a solid fastener to a solid composition, comprising placing the solid composition in a chamber, positioning a first gas phase which comprises a substance that decomposes to a material that adheres to the solid composition during the process proximate the solid composition, directing at least one energy beam to the solid composition to selectively deposit material from the first gas phase on the solid composition to form the solid fastener attached to the solid composition.

In this second aspect of the invention, deposition of material from the gas phase is deposited on the solid composition and bonded to the composition. The fastener can also be made to a porous surface region in the solid composition where the gas phase will decompose into the surface porous region to create a strong combined mechanical and chemical bond to the solid where the fastener is located. The shape of the fastener desired is ambiguous and can be selected by the operator during the practice of this invention. The fastener is three-dimensional and of arbitrary shape. The layers of the material which make up the shape can differ in two dimensions (i.e., width and length) such that the resulting structure has a shape of differing proportions at various heights on the structure. Generally, in the practice of this second aspect of the invention, it is contemplated that fasteners have a height greater than about 10 microns as measured relative to surface of the solid composition. The fastener can be of material which conducts electricity or which does not conduct electricity, and either conducting or nonconducting materials can be independently used.

In either the first or second aspects of this invention, the fastener or joint can also be attached to a porous surface region to create a strong combined mechanical and chemical bond where the fastener is located. In the present invention it will be possible to make integral fasteners directly from the same material or a material that is compatible and overcomes the degradation of properties associated with many of the present approaches to fastening ceramics. This invention has the advantage of being able to directly form a joint or a fastener out of the same material as being joined or fastened or from a compatible material directly from the gas phase. This eliminates the need to physically place the filler material in the appropriate location since the gas precursor filler material will be present in all locations to be joined or fastened. The only requirement will be to locate a position controlled energetic beam directly to the location where joining or fastening will occur and to complete the joint or build up the fastener in that region by decomposition of the gas phase to create the desired joint or fastener. The fastener then can be formed into an arbitrary shape such that it can be used to fasten in the desired manner or can be used for any other purpose.

With the use of a series of gas compositions or power levels it will be possible to create a chemical gradient in the fastener in the vicinity of the solid composition to be fastened to get mechanical and thermal enhanced compatibility. This can include the deposition of a composite compound of two or more phases from a gas phase mixture. In addition, this approach allows the use of many materials for joining or creating an integral fastener that cannot be presently employed.

This invention, in a third respect, is an article which comprises a first solid composition and a second solid composition that have been joined by a process which comprises placing a first solid composition having a first joining zone and a second solid composition having a second joining zone in a chamber, positioning a first gas phase, which comprises a substance that decomposes to a material that adheres to the first and second solid compositions during the process, proximate the first joining zone and the second joining zones, directing an energy beam to the first and second joining zones to selectively deposit material from the first gas phase on the first joining zone and the second joining zone until a joint is formed between the first and second solid compositions wherein the joint adheres to the first and second compositions at the first and second joining zones.

This invention, in a fourth respect, is an article comprising a solid composition having a fastener attached thereto, the article having been prepared by a process which comprises: placing the solid composition in a chamber; positioning a first gas phase, which comprises a substance that decomposes to a material that adheres to the solid composition during the process, proximate the solid composition; directing at least one energy beam to the solid composition to selectively deposit material from the first gas phase on the solid composition to form the solid fastener attached to the solid composition.

DETAILED DESCRIPTION OF THE PREFERRED EMBODIMENTS

Figure 1:
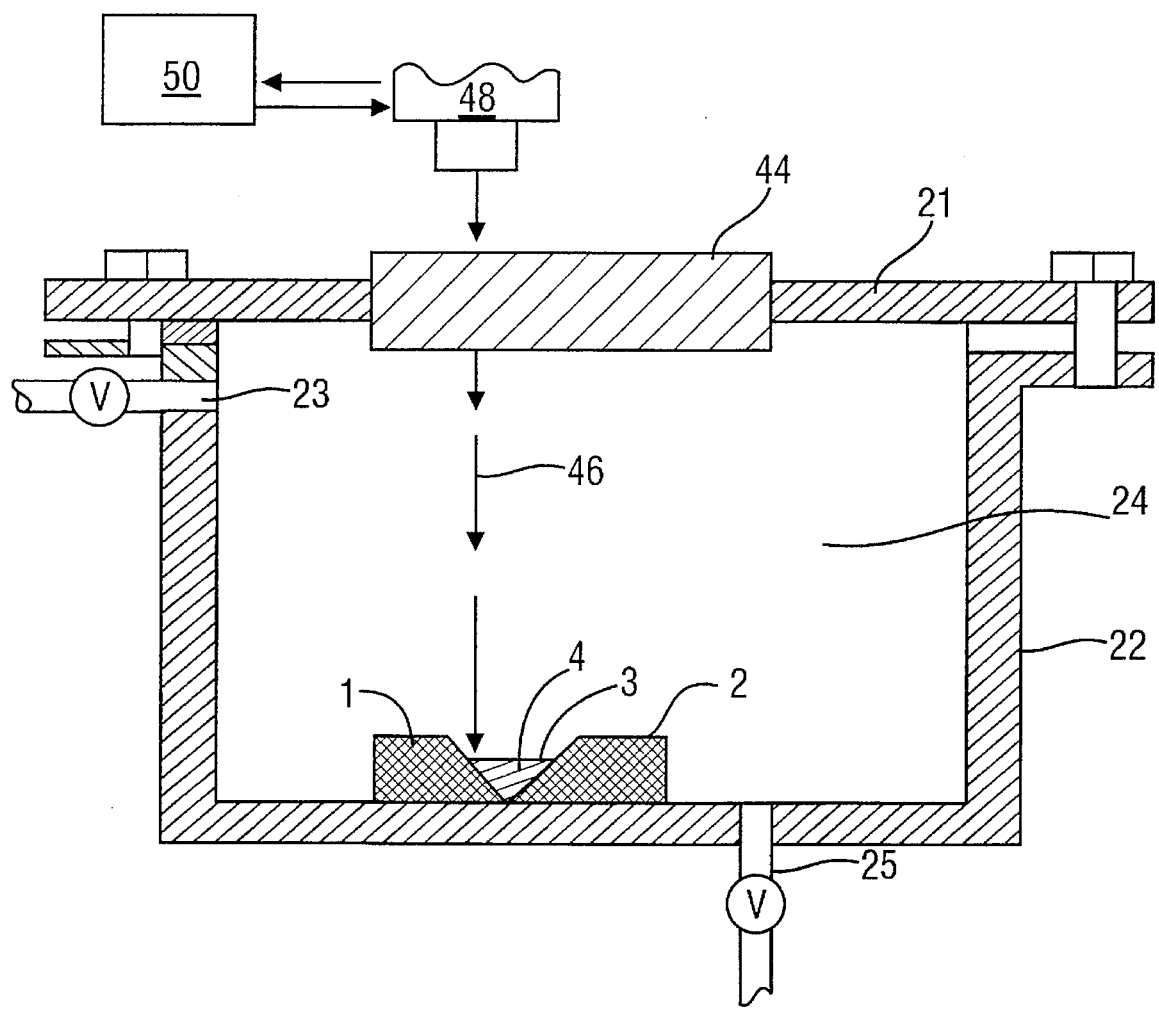
FIG. 1 is a sectional view of two solid compositions being joined in accordance with the practice of the first aspect of this invention.

The first aspect of the present invention may be utilized to join solid compositions derived from metals, ceramics, composites and combinations thereof. In the second aspect of the present invention, the process may be utilized to produce fasteners attached to a solid composition, the fastener being of any shape such as, for example, a hook, peg, button, or a more complicated shape, or on the other hand the fastener can be of simple shape such as a simple bump or ridge or as needed to repair a crack or chip. The present invention is advantageously useful to join discrete, pre-existing solid compositions that have not been made by layer by layer addition of material from a gas phase selective beam deposition. In both respects of the present invention, the solid compositions to be joined or to have a fastener attached thereto may have been previously produced by methods other than by gas phase selective beam deposition.

The gas phases described throughout this application may comprise gases including but not limited to organometallic, hydrocarbon, chloride, fluoride, oxide, nitride or polymer precursor gases. The gas phase contains one or more substance (gas) that decomposes to a material that adheres to the solid compositions during the practice of this invention. In one embodiment of this invention, gas phase comprises a plurality of organometallic, hydrocarbon, chloride, fluoride, oxide, nitride or polymer precursor gases and may contain carrier gases including but not limited to helium, argon, hydrogen and nitrogen. Moreover, the gas used in the gas phase decomposes in the practice of this invention to provide decomposed layers which are capable of attaching (by a chemical or metal bond) to the one or more solid composition being jointed or having a fastener being attached thereto. Thus, selection of gas for the gas phase depends on the material making up the solid composition. For example, if two solid compositions are made of silicon carbide (SiC), then tetramethylsilane may be selected as the gas since tetramethylsilane decomposes to SiC during the practice of this invention. It should be appreciated however, that gases other than tetramethylsilane can be used so long as the decomposed product is capable of adhering or attaching (bonding) to the solid composition or the last layer deposited in the practice of this invention. A combination of tetramethylsilane and ammonia in the proper proportions will decompose into silicon nitride which can directly join silicon nitride solid parts or form a fastener to silicon nitride. A metal fastener to SiC could be formed by decomposition of titanium tetrachloride into Ti that would be attached in the desired location on the SiC and built into the desired metallic fastener shape. Representative examples of organometallic gases include $Al_2(CH_3)_6$, $Ni(CO)_4$ and $Fe(CO)_5$. Representative examples of hydrocarbon gases include methane, ethane, ethene, and acetylene. Representative examples of polymer precursor gases include alkyl halides and alkyl amines. The following references are incorporated herein by reference to the extent the references supplement, explain, provide a background for or teach methodology, techniques and/or gases employed herein: D. Bauerle, *Chemical Processing with Lasers*, New York: Springer-Verlag, p. 70, (1986); G. S. Girolami and J. E. Gozum, "Low Temperature MOCVD Routes to Thin Films from Transition Metal Precursors," p. 319 in *Chemical Vapor Deposition of Refractory Metals and Ceramics*, T. M. Besmann and B. M. Gallois editors, MRS, Pittsburgh, (1990); M. G. Hocking, V. Vasantasree and P. S. Sidky, *Metallic and Ceramic Coatings*, New York: Wiley & Sons, p. 171, (1989); and D. P. Stinton, T. M. Besmann and R. A. Lowden, "Advanced Ceramics by Chemical Vapor Deposition Techniques," *American Ceramic Society Bulletin*, vol. 67(2), p. 350, (1988).

In a preferred embodiment, the gas phase comprises gas phase precursor and plasmas thereof including but not limited to one or more combinations of $CH_4$ (methane), $C_2H_2$ (acetylene), $C_2H_4$ (ethylene), $C_2H_6$ (ethane), $Al_2(CH_3)_6$, $Ni(CO)_4$, $Fe(CO)_5$, $SiH_4$, $Si_2H_6$, $Si(CH_3)_4$ (tetramethylsilane), $TiCl_4$, $BCl_3$ and $WF_6$. The gas phase may further comprise a carrier gas, representative examples of which include $CO_2$, $H_2$ (hydrogen), He (helium), Ar (argon)

and $N_2$ (nitrogen). Further, the selectively deposited material preferably comprises one or more combinations of directly deposited materials including but not limited to amorphous carbon, graphitic carbon, diamond, TiN, $Ti_4C_3$, SiC, $Si_3N_4$, $SiO_2$, $TiB_2$, Ni, Ti, Al, Fe, W, Si, $Al_2O_3$, $TiO_2$ and TiC. A gas phase preferably comprises a gas or gases having the properties of decomposing and/or polymerizing when exposed to directed energy beams that supply a sufficient thermal, decomposition or disassociation energy and which decompositions adhere to the solid compositions. For example, where the gas phase comprises acetylene and hydrogen and the laser beam has an approximate energy of 20 watts at a wavelength of 10.6 microns, the material glassy carbon will be deposited and attached to the one or more solid compositions.

As used herein, the term "gas phases" includes but is not limited to multi-component gases and gas plasmas. Further, as used herein, the terms "gas phase" and "gas carrier" include but are not limited to gases and gas plasmas. Each directing step preferably either thermally decomposes or photodecomposes the proximate gas phase to deposit material on and attached to the solid composition or compositions. Additionally, the wavelength or wavelengths from the energy beam or beams is selectable to selectively deposit material from the desired gas phase.

Further, the solid composition or compositions can be selectively heated by, for instance, laser heating to selectively deposit material by thermal decomposition of the gas at the surface from the gas phase or to further selectively dissociate gas molecules of the gas phase.

Another method of joining two solid compositions or attaching a fastener to a solid composition in accordance with the present invention comprises the steps of positioning a gas phase proximate one or more solid compositions, scanning the aim of at least one directed energy beam relative to the one or more solid compositions and selectively depositing material from the gas phase in a first layer on and attached to the one or more solid compositions. Subsequently, the aim of at least one directed energy beam is scanned across the solid compositions and material is selectively deposited from the gas phase in a second layer on the one or more solid compositions, including the substeps of joining the first and second layers during the scanning, and depositing of the second layer and successively scanning the aim of at least one directed energy beam across the target area and selectively depositing material to produce successive layers joined to a previously deposited layer and producing a joined composition, or a fastener attached to a solid composition, each comprising a plurality of joined layers. In this regard, the resulting joint or fastener is composed of different compositions or is composed of a continuous gradient of composition prepared by continuously changing the gas phase.

The joints and fasteners formed by the practice of this invention can be modified or strengthened. Thus, a reenforcing material can be positioned on the solid composition or on one or more joining zones during the process to incorporate the reenforcing material in the joint. The reenforcing material can be added before, during or after a layer is deposited. Representative examples of reenforcing materials include powders or granular forms of solid materials such as made of the solid composition or of other composition, fibers such as made of carbon, and strips of metal wire of various gauges.

Each scanning step further comprises the substep of selecting at least one wavelength of the energy beam or beams to selectively deposit material from the gas phase. In a preferred embodiment, the selected beam wavelength enables the selective thermal decomposition of material from the gas phase. In another preferred embodiment, the selected beam wavelength enables the selected photodecomposition of material from the gas phase. In still another preferred embodiment, the selected wavelength beam wavelength enables selective thermal decomposition and photodecomposition of material from the gas phase. Each scanning step further comprises the substep of selectively heating the target area to selectively deposit material from the gas phase and further to selectively dissociate gas molecules of the gas phase.

Yet another method of the present invention comprises the steps of positioning a first gas phase proximate one or more solid compositions in a target area, controlling the temperature of the surface of the one or more solid compositions and enabling a portion of the first gas phase to condense in a first layer on the surface of the one or more solid compositions and scanning the aim of at least one first directed energy beam relative to the surface and selectively evaporating material from the first layer. A supplemental first gas phase may, as appropriate, be positioned proximate the one or more solid compositions in the target area, condensed and selectively evaporated. The supplemental first gas phase preferably comprises an easily removable material including but not limited to $Si_2H_6$, $C_3H_8$, and $H_2O$, enabling suspended spans or overhang structures to be formed in a subsequent layer immediately above the condensed supplemental first gas phase material. The easily removable material utilized in the fabrication of suspended spans and overhang-type structures also includes but is not limited to powders. Subsequently, a second gas phase is positioned proximate the one or more solid compositions in the target area. The temperature of the surface is controlled and enables a portion of the second gas phase to condense on the first layer, and the aim of at least one first directed energy beam is scanned across the surface selectively evaporating material from the second layer including the substeps of joining the first and second layers during the condensing and scanning of the second layer and positioning successive gas phases proximate the one or more solid compositions in the target area to thereby provide a joint or a fastener attached to the one or more solid compositions. Further, each scanning step preferably also comprises the step of scanning the aim of at least one second directed energy beam across the surface and selectively decomposing the deposited gas in each layer of material. Additionally, each scanning step preferably further comprises the substep of controlling the wavelength or wavelengths of each directed energy beam or beams. Following formation of the spans or overhang structures which make up the joint or fastener, the easily removable material is preferably removed by a secondary process. A secondary process includes but is not limited to boiling, shaking or a selective chemical reaction.

Still another method of the present invention comprises the steps of positioning a first gas phase proximate one or more solid compositions, controlling the temperature of the surface of the one or more solid compositions and enabling a portion of the first gas phase to condense in a first layer on the surface, scanning the aim of at least one first directed energy beam across the surface and selectively transforming material in the first layer into a material having a higher melting temperature than the condensed first gas phase material, positioning a second gas phase proximate the one or more solid compositions, controlling the temperature of the surface of the one or more solid compositions and enabling a portion of the second gas phase to condense on the first layer, scanning the aim of at least one first directed energy beam across the surface and selectively transforming material in the second layer into a material having a higher melting temperature than the condensed second gas phase material, including the substeps of joining the first and second layers during the condensing and scanning of the second layer and positioning successive gas phases proximate the surface, controlling the temperature of the surface and enabling a portion of the successive gas phases to condense and join in successive layers on the surface and scanning the aim of at least one first directed energy beam across the surface and selectively transforming layers of the material and producing a joint or attached fastener comprising a plurality of layers. Additionally, each scanning step preferably comprises the further step of scanning the aim of at least one second directed energy beam across the surface and selectively decomposing each layer of material. Each step of scanning preferably further comprises the substep of controlling the wavelengths of at least one directed energy beam.

An additional aspect of the present invention is a method which provides for forming an integral three-dimensional object comprising the steps of positioning one or more solid compositions in a chamber substantially able to contain a gas, introducing a gas phase into the chamber, utilizing means for directing an energy beam into the chamber to change a property of at least part of the gas phase to deposit a layer of material and repeating the depositing and utilizing steps to form a plurality of these layers, each layer being integrally bonded to the next adjacent layer by the utilizing steps to form an integral three-dimensional object which can be a joint or a fastener.

In the practice of this invention it may be desirable to preheat the solid composition(s) to improve the quality of the bond between joint on fastener and the solid composition(s). Such preheating can be accomplished by an energy beam or by a wide variety of other heat sources.

An apparatus useful for producing a joint or an attached fastener in the practice of the present invention comprises a chamber housing a target area where the chamber enables substantial containment of a gas phase, a system for introducing a gas phase into the chamber, a system for selectively producing at least one directed energy beam, a system for directing the beam to the target area where the one or more solid compositions are placed and for scanning the target area with the aim of the beam in a selective pattern, a system for controlling the operation of the beam to selectively deposit material from the gas phase on the one or more solid compositions during the scanning pattern including a computer system operatively coupled to the directing system to monitor the aim of the beam during the scanning pattern.

The chamber used in this invention can be of any size, configuration or made of any material which functions to retain the gas precursor proximate the solid composition such that the solid composition is substantially blanketed with the gas. Thus, a loose fitting chamber can be used in which gas can escape from the chamber, but leaks are sufficiently small or the flow of gas into the chamber sufficiently high that the gas precursor can be maintained in the proximity of the solid compositions, including joining zones of the solid compositions, in a concentration sufficient to enable the practice of the first or second aspects of this invention.

The computer system is preferably programmed with information indicative of the desired boundaries of a plurality of cross-sectional regions of the joint or fastener, the computer system further preferably being operable for modulating the beam when the aim of the beam is within the desired boundaries of the first cross-sectional region to deposit a first layer of material on and attached to the one or more solid compositions, then being able to modulate the beam when the aim of the beam is within the desired boundaries of the second cross-sectional region to deposit a second layer of material and join the first and second layers of material, and the computer system further modulating the beam when the aim of the beam is within succeeding desired boundaries of succeeding cross-sectional regions to deposit succeeding layers of material to join layers to thereby form the desired joint or fastener.

Preferably, the computer system is programmed to the desired boundaries of a plurality of serial arranged parallel cross-sectional regions of the joint or the fastener. In an alternative preferred embodiment, the computer system is programmed with the overall dimensions and configuration of the joint or the fastener and the computer system is operable to numerically divide the joint or the fastener into a plurality of serial, parallel, discreet, cross-sectional or other regions and is able to derive the desired boundaries for each region.

In a preferred embodiment, the scanning system comprises a pair of mirrors driven by respective galvanometers. In another preferred embodiment, the scanning system comprises a system for positioning the one or more solid compositions in the chamber relative to the beam. Further, in all preferred embodiments of the present invention the directed energy beam preferably comprises at least one laser beam, ion beam, electron beam, focused plasma beam or arc, or combination thereof.

The solid compositions which can be joined together in the first aspect of this invention or which can have fasteners attached to the compositions can be of virtually any material. Representative examples of materials which can be used as solid compositions include ceramics, metals or composites thereof. Representative examples of useful ceramics include alumina, silicon carbide and silicon nitride. When two solid compositions are to be joined, the selection of the appropriate gas phase typically leads to selection of gas phases which will form materials the same as the materials making up the solid compositions or compatible with it. For example, if the solid compositions are made of a ceramic such as silicon carbide, then the gas phases will be selected such that silicon carbide is deposited and becomes attached to the two or more solid compositions to thereby form a joint. Selection of an appropriate gas phase is based on the criteria that the deposited material from the gas phase be suitable and capable of attaching and bonding to the solid composition and the conditions of deposit not detrimental to the integrity of the solids being joined. Multiple depositions of gas phases are contemplated in the practice of this invention whereby various layers may be deposited on and attached to solid compositions such that the layers have different coefficients of expansion. Thus, graded interfaces may be formed through the practice of this invention.

In preferred embodiments of the present invention, the energy beam is a laser beam. The wavelength of the laser beam can be adjusted such that the point on the solid composition is heated to sufficient temperature to cause deposition on an attachment to the solid composition of material from the gas phase. For example, a $CO_2$ 10.6 micron wavelength laser or a Nd-YAG laser having a wavelength of 1.06 microns can be used in the practice of this invention. Two or more lasers can be used simultaneously in the practice of this invention such as to partially photoexcite the desired material to be deposited while it is in the gas phase and also heating the surface of the solid compositions to thereby deposit an attached material from the gas phase to the solid composition.

An assembly line-type method is also contemplated in the practice of this invention. In this regard, it is contemplated that multiple ports or multiple chambers can be employed where the one or more solid composition is positioned, each chamber holding a different gas phase or each chamber or part having a different laser so that different materials from the same gas phase containing a plurality of gases can be selectively deposited in each chamber or part.

It should be appreciated that if the gas phase is heated too high, decomposition may occur in the gas phase whereby materials are condensed out of the gas phase but not on the surface of the solid compositions. In this case, the materials are not attached to the solid compositions. Therefore, the wavelength and intensity of the energy beam is selected so that deposition of material from the gas phase occurs on the surface of the solid composition so that the material is attached and bonded to the solid composition. The generalized method for gas phase selective beam deposition used in the practice of this invention is generally described in U.S. Pat. Nos. 5,017,317; 5,135,695; 5,169,579; and 5,306,447, all incorporated herein by reference. In the references incorporated herein, it is noted the deposition of material occurs on a target surface but the deposition of material does not lead to attachment of the material from the gas phase onto the target area. In the noted patents, free form shapes are created, but are not bonded to preexisting solid surfaces. The present invention distinguishes from these patents in this regard since joints or fasteners are directly attached and bonded to preexisting solid compositions.

Turning now to the drawings, the methods of the present invention are shown to enable the production of joints and attached fasteners. The joints and fasteners produced utilizing the present invention preferably are of structural dimension greater than approximately 10 microns, more preferably greater than approximately 100 microns.

FIG. 1 illustrates the joining of two solid pieces and production of a joint. In FIG. 1, a first solid composition 1 and a second solid composition 2 are positioned in a chamber 22 in a target area. The chamber 22 surrounds also a gas phase 24 which is substantially contained in chamber 22. Gas inlet and valve 23 allow gas phase 24 to enter chamber 22. Gas outlet and valve 25 allow gas phase 24 to exit chamber 22. Top of chamber 22 is preferably removable to enable removal of the joined solid compositions. Chamber 22 further comprises a window 44 which is transparent to the energy beam through which laser beam or beams 46 may pass. The laser beam is generated by laser beam generating and scanning system 48 which is controlled by computer control 50. In operation computer control 50 preferably contains information sufficient to determine the two-dimensional image of each of the plurality of layers to be deposited to form joint 3. Joint 3 is illustrative and a wide range of joint shapes can be used. This information is transferred to laser beam generating and scanning system 48 to control laser beam 46. Laser beam 46 scans each successive top layer 42 during the fabrication of joint 1 and is selectively operative to deposit material 4 from gas phase 24 in the necessary pattern to produce each layer of joint 3. Laser beam 46 will be active where material deposits are necessary to fabricate the current top layer of joint 3. Removable top of chamber 21 enables removal of completed joined compositions from chamber 22. U.S. Pat. No. 4,863,538 discloses use of a computer to control a laser beam generating and scanning system, a disclosure of which is expressly incorporated herein by reference.

Figure 2:
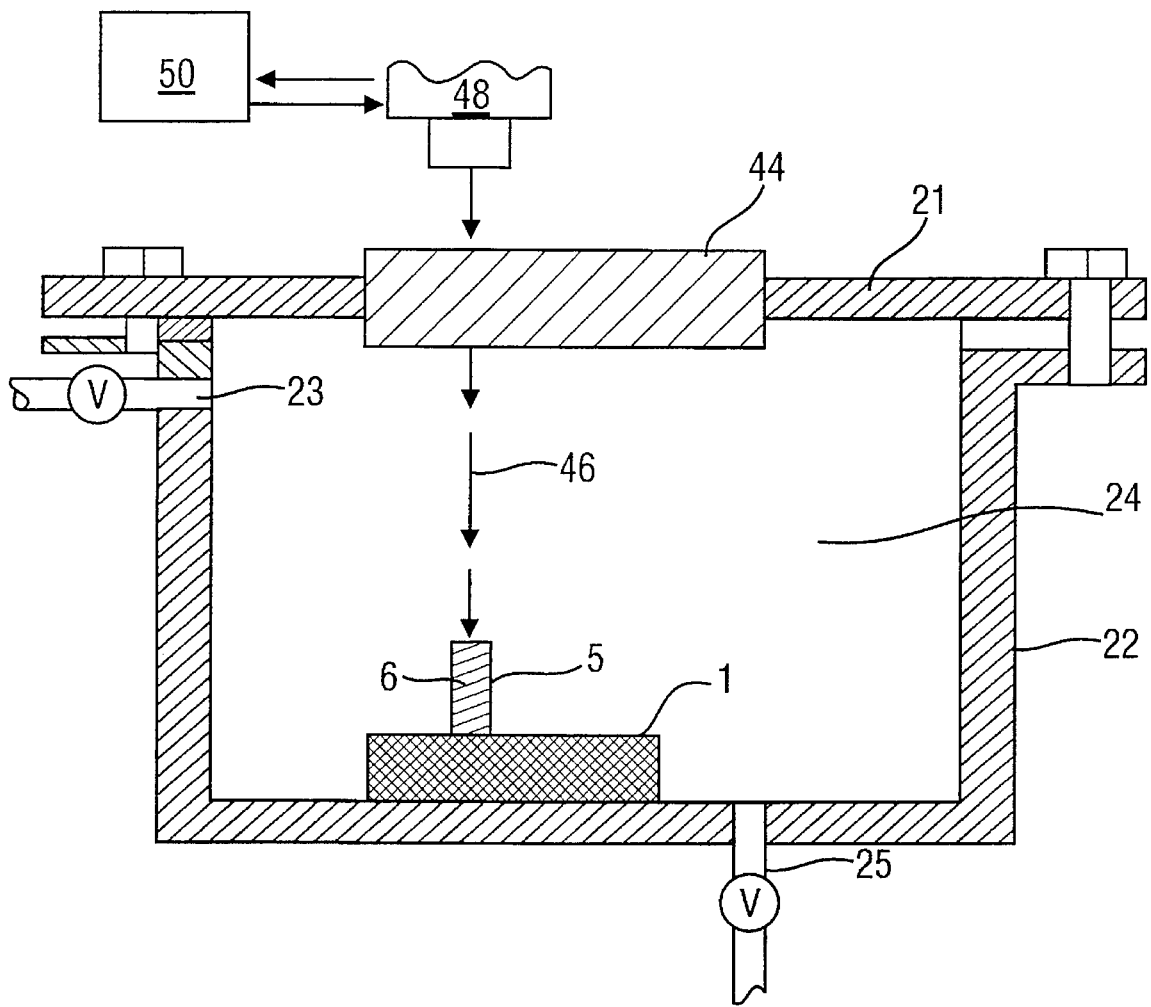
FIG. 2 is a sectional view of a solid composition to which is being attached a fastener in accordance with the practice of this invention.

In both FIG. 1 and FIG. 2, in an alternate embodiment, gas phase 24 may comprise a plurality of gases or a plurality of gas phases. Laser beam 46 may comprise a single laser beam or a plurality of laser beams coordinated to selectively thermally decompose, photodecompose or otherwise decompose gas phase 24 to deposit material on and attach and bond to solid compositions. The computer control 50 and laser beam generating and scanning system 48 preferably enable control of the amount of energy produced in laser beam 46 and the wavelength of laser beam 46. Therefore, in a preferred embodiment wherein gas phase 24 comprises a plurality of gases, a selected level of energy or a selected wavelength or a combination thereof for laser beam 46 enables the selective decomposition of gas phase 24. The decomposition of gas phases 24 results in the deposition of material from the gas phase on top layer of joint 3 creating a new top layer. A laser beam of different power or wavelength than the initial laser beam may then be activated by computer control 50 and laser beam generating and scanning system 48 to decompose a second gas phase and deposit a subsequent top layer of material from the second gas phase on and attached to joint 3. In this preferred embodiment, layers of differing materials may be deposited selectively from the plurality of gases comprising gas phase 24. A single layer may contain area of a first deposited material and a second area of a second deposited material by providing a first gas phase and selectively scanning the energy beam across the first area and then providing a second gas phase and selectively scanning the energy beam across the second area. In an alternative preferred embodiment, a single gas phase 24 is placed in chamber 22 through gas inlet and valve 23. Laser beam 46 thermally decomposes or photodecomposes gas phase 24 producing a top layer on joint 3. The process may be repeated to produce a second layer or the gas phase may be evacuated from chamber 22 through gas outlet and valve 25 and replaced with another gas phase before a subsequent top layer is deposited. Additionally, laser beam 46 may selectively heat joint 3 or first solid composition 1 or second solid composition 2 to selectively dissociate gas molecules from gas phase 24 and deposit material in joint 3 which is attached and bonded to first solid composition 1 and second solid composition 2. Still another preferred embodiment of the present invention comprises the steps of positioning a first gas phase 24 proximate the first solid composition 1 and second solid composition 2. The temperature of the first solid composition 1 and second composition 2, and preferably chamber 22, is controlled enabling first solid composition 1 and second composition 2 to be at a temperature below that of the walls of chamber 22, enabling a portion of first gas phase 24 to condense in a first layer on the surface of target area 26.

In the process according to the present invention, as shown in FIG. 1, the joint 3 is built up, layer by layer, where each layer is selectively scanned and joined to the preceding layer.

Where material is condensed on first solid composition 1 and second solid composition 2 prior to scanning, gas phase 24 preferably comprises gases having a boiling point below the controllable ambient temperature of chamber 22. For example, gas phase 24 may comprise polymer precursors such as acetylene, methyl chloride (and dimethylamine).

All preferred embodiments of the present invention preferably include the substep of joining each layer of a binding material during the buildup process. Where material is selectively deposited and attaches to and bonds with solid compositions, laser 46 deposits each successive layer and joins a newly deposited layer to the previously deposited layer to produce a joint or fastener comprising a plurality of joined layers. Where laser beam 46 evaporates condensed material to form a layer, each layer is joined to the previous layer preferably during the condensing of the material. This produces a joint or fastener comprising a plurality of joined layers. In all preferred embodiments of the present invention, the computer control is enabled to either determine the boundaries of a plurality of cross-sectional regions of joint 3 or fastener 5 after being programmed with the desired boundaries of the finished joint or fastener or is programmed with the desired boundaries of a plurality of serially arranged, parallel cross-sectional regions of joint 3 or fastener 5.

Turning to FIG. 2, there is shown chamber 22 and so forth as described in FIG. 1, with the exception that a single solid composition 1 and fastener 5 is shown. Through practice of the present invention, layers of material 6 from the gas phase 24 are selectively deposited, attached and bonded to first solid composition 1 to build fastener 5. In all other respects, FIG. 1 and FIG. 2 and operation of the invention in FIG. 1 and FIG. 2, are the same.

Further modifications and alternative embodiments of the methods of the present invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of the elements shown in the present disclosure. For example, equivalent elements or materials may be substituted for those illustrated and described herein, elements may be reversed and certain features of the present invention may be utilized independently of the use of other features all as would be apparent to one skilled in the art after having the benefit of this description of the invention.

What is claimed is:

1. A process for joining solid compositions, comprising:

placing a first solid composition having a first joining zone and a second solid composition, discrete from said first solid composition, having a second joining zone in a chamber;

positioning a first gas phase, which comprises a substance that decomposes to a material that adheres to the first and second solid compositions during the process, proximate the first joining zone and the second joining zone;

directing an energy beam to the first and second joining zones to selectively deposit material from the first gas phase on the first joining zone and the second joining zone until a joint is formed between the first and second solid compositions wherein the joint adheres to the first and second compositions at the first and second joining zones.

2. The process of claim 1, wherein the first composition and second composition are made of the same material.

3. The process of claim 1, wherein the deposited material from the first gas phase is the same material as the first and second composition.

4. The process of claim 1, further comprising positioning a second gas phase proximate the target area; scanning the aim of the at least one energy beam relative to the target area and selectively depositing material from the second gas phase in a second layer on the joint to produce a joint having plurality of joined layers.

5. The process of claim 4, wherein the joint is composed of different compositions or is composed of a continuous gradient of composition prepared by continuously changing the gas phase.

6. The process of claim 1, wherein the first gas phase comprises an organometallic, a hydrocarbon, chloride, fluoride, oxide, nitride or polymer precursor gas.

7. The process of claim 1, wherein the at least one energy beam comprises at least one laser beam.

8. The process of claim 1, wherein the at least one energy beam comprises at least one electron beam.

9. The process of claim 1, wherein the at least one energy beam comprises at least one focused plasma beam or arc.

10. The process of claim 1, wherein the at least one energy beam comprises at least one ion beam.

11. The process of claim 1 wherein the gas phase comprises tetramethylsilane.

12. The process of claim 1, further comprising preheating the first and second compositions prior to forming the joint.

13. The process of claim 1, wherein the first solid composition or the second solid composition or both contain a porous region in which material from the gas phase is deposited such that the joint is both mechanically and chemically bonded to the first and second solid compositions.

14. The process of claim 1, further comprising positioning a reenforcing material in the first joining zone or the second joining zone or both the first and second joining zones to incorporate the reenforcing material in the joint.

\* \* \* \* \*